United States Patent [19]
MacMullen et al.

[11] Patent Number: 5,963,098
[45] Date of Patent: Oct. 5, 1999

[54] FM CANCELER LOOP TO REDUCE SHOCK AND VIBRATION EFFECTS IN CRYSTAL OSCILLATORS

[75] Inventors: Alexander MacMullen, Rolling Hills Estates; Vaughn L. Wright, Malibu, both of Calif.

[73] Assignee: Technology Service Corporation, Los Angeles, Calif.

[21] Appl. No.: 08/918,715

[22] Filed: Aug. 22, 1997

[51] Int. Cl.$^6$ .............................. H03B 1/04; H03B 5/04; H03B 5/32

[52] U.S. Cl. .......................... 331/1 R; 331/36 C; 331/65; 331/116 R; 331/158; 331/175; 331/177 V

[58] Field of Search .................................. 331/1 R, 36 C, 331/65, 116 R, 158, 175, 177 V

[56] References Cited

U.S. PATENT DOCUMENTS

| | | | |
|---|---|---|---|
| 3,614,649 | 10/1971 | Gerig | 331/17 |
| 3,617,922 | 11/1971 | Bernstein | 331/1 |
| 3,835,413 | 9/1974 | Epstein | 331/1 |
| 3,946,329 | 3/1976 | Caspari | 331/4 |
| 4,117,405 | 9/1978 | Martinez | 331/1 A |
| 4,188,582 | 2/1980 | Camalte et al. | 331/17 X |
| 4,336,505 | 6/1982 | Meyer | 331/1 R |
| 4,409,563 | 10/1983 | Vandegraaf | 331/11 |
| 4,490,688 | 12/1984 | Borras et al. | 331/1 A |
| 4,542,533 | 9/1985 | Parker | 455/182 |
| 4,849,993 | 7/1989 | Johnson et al. | 331/1 A |
| 5,036,291 | 7/1991 | Marz | 331/23 X |
| 5,568,096 | 10/1996 | Haartsen | 331/1 R |

OTHER PUBLICATIONS

Ballato,A.,"Resonators Compensated For Acceleration Fields," US Army Electronics Technology & Devices Laboratory, 2–33–322 1979, p. 1; Besson et al., "Design of A Bulk Wave Quartz Resonator Insensitive to Acceleration," 2–33–337 1979, pp. 1–2.

Galani et al., "Analysis and Design of a Single–Resonator GaAs FET Oscilator with Noise Degeneration," IEEE Transactions on Microwave Theory and Techniques, vol. MTT–32, No. 12, Dec. 1984, pp. 1556–1565.

Rao et al., "Voltage–Controlled Oscillator with Time–Delay Feedback," Naval Research Laboratory Report 8138, Sep. 8, 1997, pp. 1–11.

Rosati et al., "Reduction of the Effects of Vibration on SC–CUT Quartz Crystal Oscillators," US Army Electronics Technology & Devices Laboratory, Proc. 35th Ann. Freq. Control Symposium, May 1981, pp. 117–121.

Su, "A Smart Signal Conditioner in Suppressing Vibration Noise Crystal Oscillators," US Army Research Laboratory, SPIE's 4th Smart Structures and Materials Symposium, Feb. 1996, pp. 1–10.

Vulcan et al., Abstract, "A Low Noise Vibration Isolated Airborne Radar Synthesizer," 6–45–330 1991, p. 1.

*Primary Examiner*—David Mis
*Attorney, Agent, or Firm*—Christie, Parker & Hale, LLP

[57] ABSTRACT

A canceler loop is used to provide negative feedback to a crystal oscillator to reduce the effects of shock and vibration on the spectral purity of the crystal oscillator. The canceler loop demodulates the output of the crystal oscillator and supplied a stabilizing voltage representative of the demodulated output to cancel frequency modulation induced by shock and vibration. The stabilizing voltage is used to cancel the noise sidebands of the frequency spectrum of the crystal oscillator output without tuning the center frequency.

8 Claims, 5 Drawing Sheets

FM CANCELER LOOP TO REDUCE SHOCK AND VIBRATION EFFECTS IN CRYSTAL OSCILLATORS

FIELD OF THE INVENTION

The present invention relates generally to crystal oscillator circuits, and more particularly, a crystal oscillator having a frequency modulated ("FM") canceler loop to reduce the effects of shock and vibration.

BACKGROUND OF THE INVENTION

Oscillators are widely used as stable frequency sources in many diverse electronic applications. For example, in communication systems, oscillators are often used to provide a stable reference signal for converting information signals to the proper frequency band. In conventional multi-channel communication systems, circuit arrangements employing multiple oscillators interconnected with various circuit elements are used to provide a selectable frequency source. This approach is generally used for high speed switching applications. For less critical applications, a more economical approach entails the use of a tunable oscillator circuit comprising a voltage controlled oscillator ("VCO") which can be phased locked to the harmonics of a reference signal. The performance of these systems, however, is highly dependent on the frequency stability of the VCO. Phase noise in the VCO output severely limits the accuracy of the entire system.

Figure 1A:
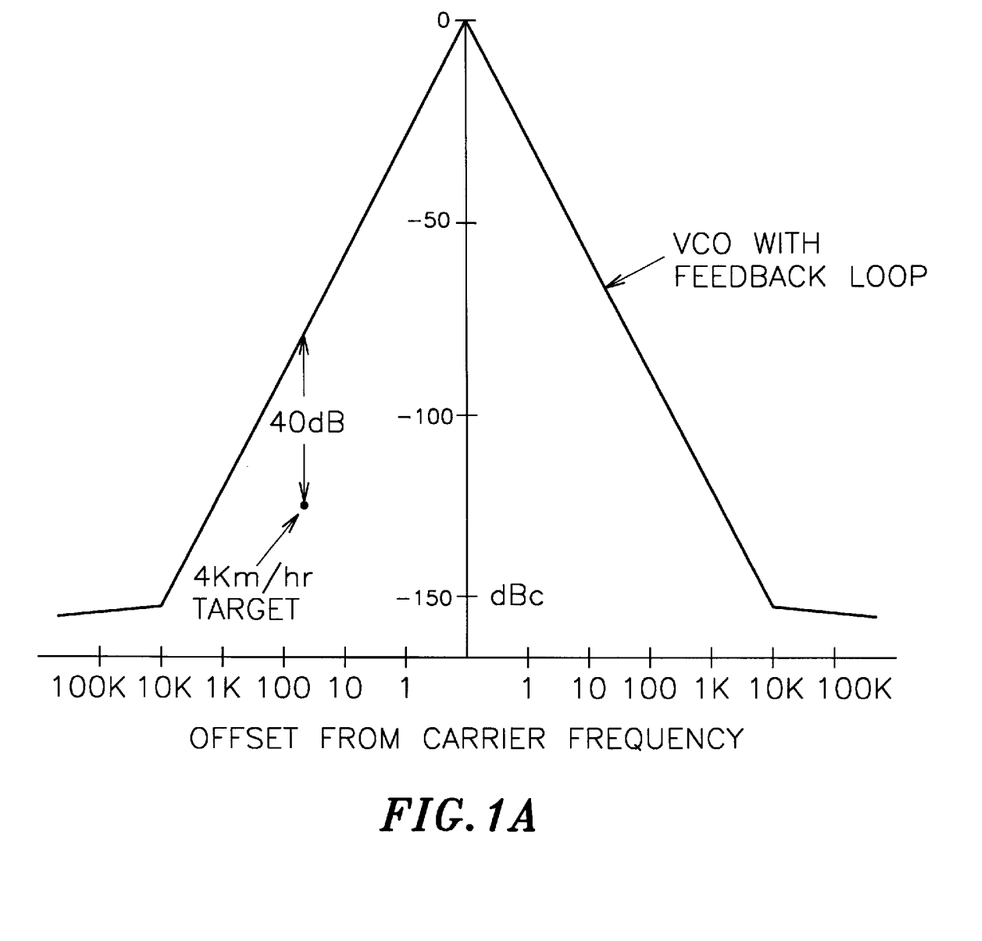
FIG. 1A illustrates the phase noise spectrum of a VCO employing a time-delay feedback circuit.

To reduce the effects of phase noise, VCO circuits of the past have been augmented with negative feedback. U.S. Pat. No. 4,336,505 by Meyer is an example of such an approach. A VCO with a time-delay feedback loop provides a noise degenerated frequency source. Because of the periodic response of the time-delay feedback loop, stable oscillation can be achieved at many frequencies across the band of interest. FIG. 1A illustrates in qualitative terms the frequency spectrum of a VCO at 10 MHz. employing a time-delay feedback loop. For many of today's applications, however, these noise sideband levels are simply too large. For example, consider an X-band radar designed to detect slow moving objects such as trucks, tanks and helicopters. In this application, the noise sidebands must be reduced by at least 40 dB to detect a 4 kilometer/hour target.

Crystal oscillator technology offers frequency stability amenable to such applications. A crystal oscillator comprises a piezo-electric crystal, usually quartz, sandwiched between two electrodes. When properly excited, an electromechanical reaction occurs causing the crystal to vibrate at the excitation frequency. Extraordinary high values of Q are obtained which, in conjunction with the fact that the characteristics of quartz are extremely stable with respect to time and temperature, account for the exceptional frequency stability.

A growing concern has recently been recognized concerning the effects vibration on frequency stability of crystal oscillators for radar systems, communication links, and other sensors. Random and sinusoidal vibration has been generally experienced when these systems are operated in mobile environments. This is due to the vibrational effects on the quartz crystal resonator in the oscillator. When the crystal undergoes vibration, frequency modulated sidebands are produced. These sidebands appear in the form of phase noise which severely degrades the spectral purity of oscillation, and significantly limits the performance of the systems in which they are used. In fact, the sensitivity of crystal oscillators to vibration is so severe that in some systems, vibrations of cooling fans in fixed ground stations, or footsteps in corridor traffic, have been shown to degrade their performance.

Figure 1B:
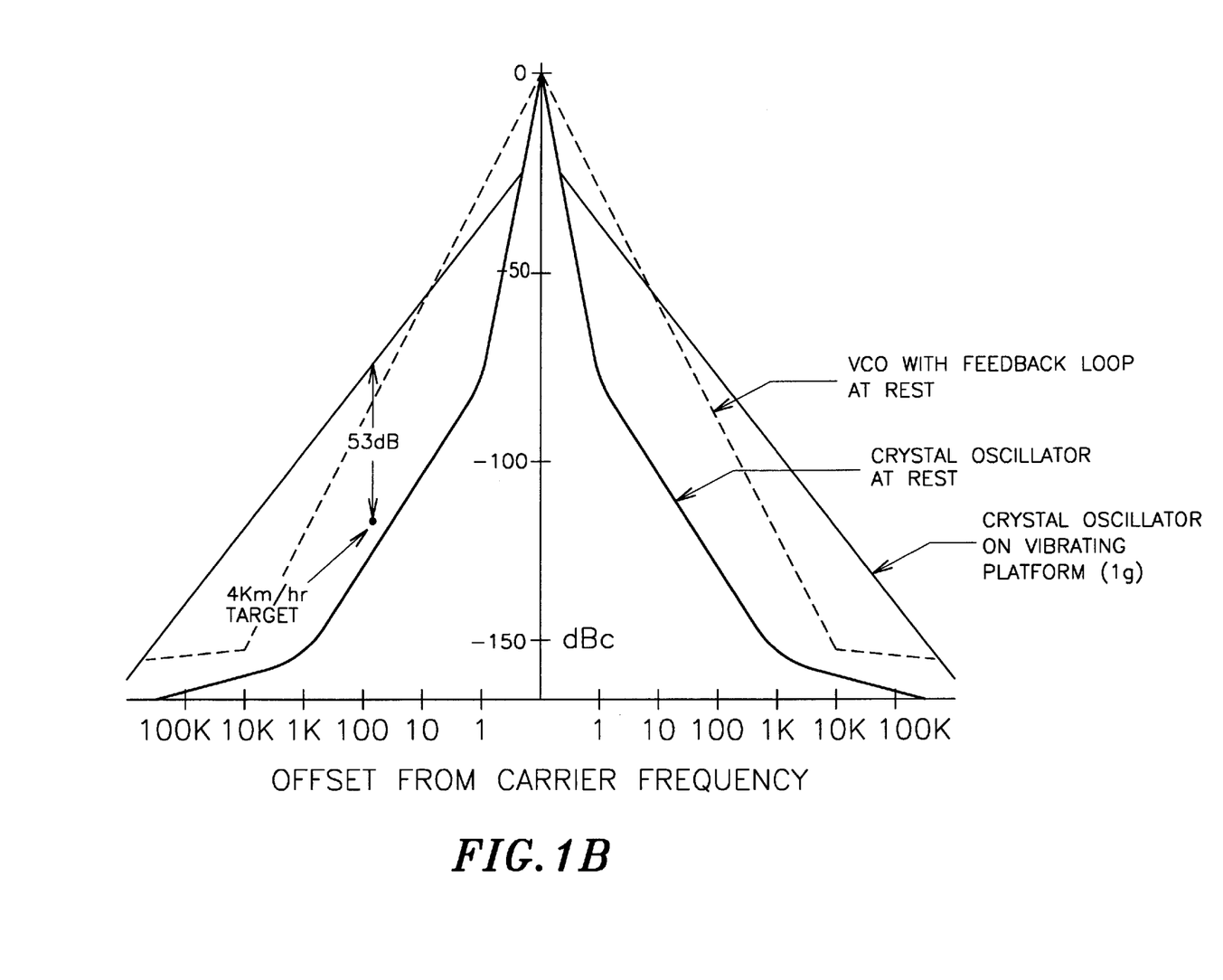
FIG. 1B illustrates the phase noise degradation of a crystal oscillator due to vibration.

The basic problem is illustrated in FIG. 1B which shows the degradation of a 10 MHz. STAMO of an X-band radar at rest and when operating in a 1 g vibration environment. As shown in FIG. 1B, a 4 kilometer/hour target can be detected with a 10 MHz crystal oscillator at rest. However, when the crystal oscillator is introduced into a 1 g vibration environment, the improvement in phase noise achieved with crystal oscillators over conventional VCO circuits with feedback is lost. In this example, the noise sidebands must be reduced by at least 53 dB to detect the target. The situation is aggravated in millimeter wave systems.

Several techniques have been employed in the past in an attempt to desensitize the oscillator frequency from the effects of vibration. Designs involving shaping of the resonators and their electrodes, selection of materials, orientation of the surfaces of the crystal relative to the crystalline axes, etc. have been employed. Circuits utilizing multiple resonators placed back to back to cancel the effect of acceleration have also been proposed. However, these approaches are limited because of the significant increase in cost of the resonator or the reduction of the resonator quality factor Q.

Another approach involves the mechanical isolation of the resonator from the vibration environment. Structures have been designed within a cabinet that are mechanically isolated from the vibrations being transmitted through the equipment. These vibration isolators essentially act as low pass filters, providing good isolation at high vibration frequencies, and none at low frequencies. If poorly designed, vibration isolators can actually amplify the vibration source at frequencies where mechanical resonances exist.

There are numerous other problems associated with the mechanical isolation of resonators. By way of example, mechanical vibration isolators require space, which is a premium in many systems, particularly in airborne systems. In addition, the measures which are introduced to improve vibration isolation generally are deleterious under shock conditions, e.g., they can lead to large physical displacements and instability. Finally, the electrical connections act as stiffeners, and degrade the isolation of the mechanical isolators.

Other approaches to control the effects of shock and vibration on crystal oscillators have also been attempted. In one such approach, the output of an accelerometer is fed back into the crystal oscillator to effectively cancel the frequency modulation. Since this arrangement employs an open loop circuit, stability is compromised. In addition, it is practically impossible to align the accelerometer so that it experiences the same vibrational effects as the crystal oscillator. Further, the acceleration sensitivity of each crystal has a unique magnitude and direction, making any open loop techniques impractical.

Attempts to attenuate the effects of frequency modulation on crystal oscillators is the subject of U.S. Pat. No. 4,555, 678, by Galani. However, Galani was not concerned with shock and vibration. The objective of the Galani patent was to degenerate the phase noise of the oscillator and produce a clean low-noise spectrum. A frequency modulated (FM) canceler loop was employed to cancel the phase noise of the oscillator. The FM canceler loop used the oscillator's crystal as a resonator. This approach would not be effective in a vibration environment, since the FM discriminator would exhibit the same response to vibration as the crystal.

Accordingly, there is a current need for an innovative approach to reduce shock and vibration effects in crystal oscillators. Ideally, this innovative approach should present a low cost solution which can be implemented using minimal space and without degrading the performance of the overall system.

SUMMARY OF THE INVENTION

According to one embodiment of the present invention, a crystal oscillator has an output signal with a frequency spectrum. The crystal oscillator has an input for receiving a stabilizing voltage. The frequency spectrum of the output signal is a function of the stabilizing voltage. A canceler loop is employed for generating the stabilizing voltage by demodulating the crystal oscillator output signal. The stabilizing voltage is coupled to the crystal oscillator input and provides noise sideband cancellation of the frequency spectrum. In contrast to conventional VCO feedback circuits, the stabilizing voltage is preferably accoupled to the crystal oscillator to prevent tuning of the center frequency.

One embodiment of the canceler loop includes a mixer. The crystal oscillator output signal is divided into two channels. One channel is the crystal oscillator output signal. In the other channel, the crystal oscillator output signal experiences a time delay. The two channels are fed to the input ports of the mixer. The output of the mixer is proportional to the phase difference between the two channels. Preferably, the delay line comprises series inductors and shunt capacitors potted in a rigid material and encapsulated. A passive mixer is also preferable in the described embodiment.

An attractive feature of the present invention is that phase noise performance equal to or better than that of the crystal oscillator at rest in FIG. 1B can be achieved. For illustrative purposes, consider a typical crystal oscillator having an acceleration sensitivity on the order of $10^{-9}$ Hertz/g of acceleration. While $10^{-9}$ Hertz may have been acceptable for many applications of the past, it is too large for many of today's applications. The canceler loop can effectively reduce this sensitivity to less than $10^{-11}$ Hz/g. The significance of this technological advancement can be best understood with reference to a 75 MHz crystal oscillator operating in a 10 g vibration environment. The frequency deviation without the canceler loop will be 0.75 Hz. With the canceler loop, the frequency deviation can be reduced to less than 0.0075 Hz. This type of frequency stability tremendously impacts the performance of systems operating in mobile environments. For example, the use of the canceler loop in airborne radar systems can significantly increase the probability of detection, maximize the range of the system and reduce false targets.

DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 2:
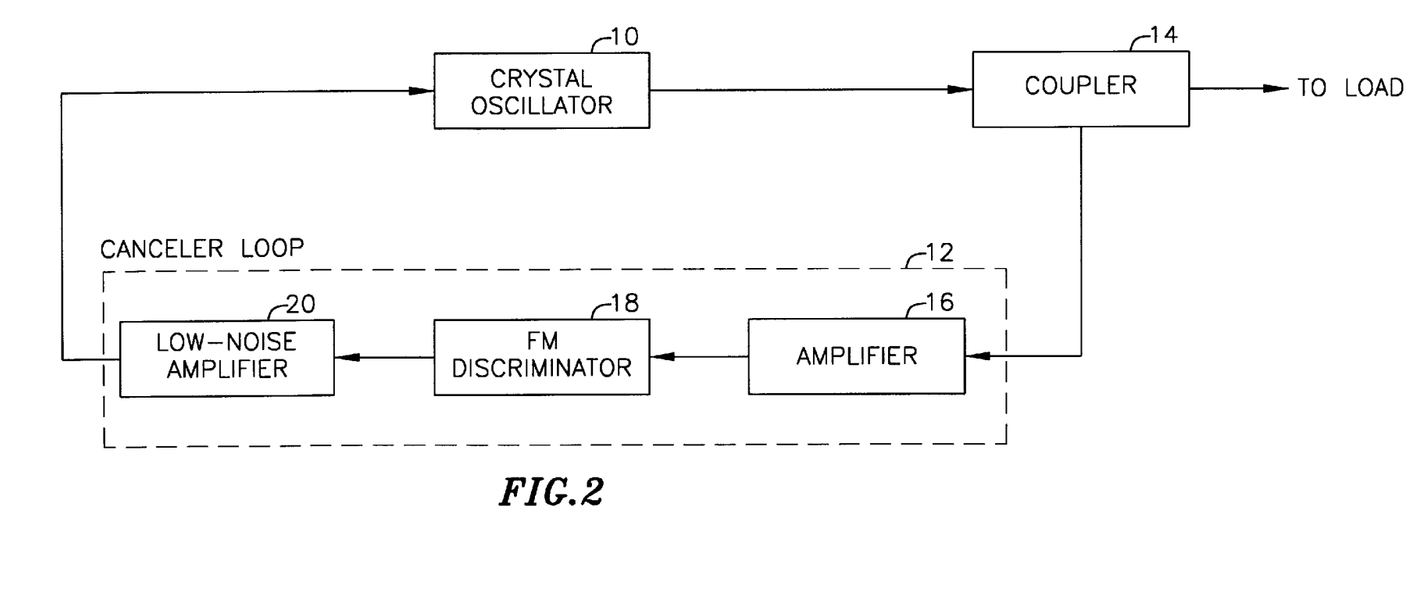
FIG. 2 is a functional block diagram of one embodiment of the present invention of a crystal oscillator employing a canceler loop.

As illustrated in the functional block diagram of FIG. 2, one embodiment of the present invention utilizes a crystal oscillator 10 with a canceler loop 12 to reduce the effects of shock and vibration on the spectral purity of the crystal oscillator. The canceler loop 12 is a negative feedback circuit which demodulates the output of the crystal oscillator 10 and supplies a stabilizing voltage representative of the demodulated output to cancel the frequency modulation induced by shock and vibration.

The output of the crystal oscillator 10 is connected to the input port of a coupler 14. The coupler 14 directs a portion of the output power of the crystal oscillator 10 to the canceler loop 12. The remainder of the output power of the crystal oscillator 10 is applied to and consumed by loads (not shown) in other parts of the overall electronic equipment.

The canceler loop 12, at its input, employs an amplifier 16. In one embodiment, the amplifier 16 is a conventional power amplifier which boosts the output power of the oscillator signal from the coupler 14. This approach increases the sensitivity of the canceler loop 12 and improves the degree of frequency stabilization of the crystal oscillator 10.

In an alternative embodiment, the amplifier comprises a frequency multiplier, either alone or in series with a conventional power amplifier, to provide gain and frequency multiplication. The frequency multiplier amplifies the oscillator frequency deviation directly as a multiplication ratio, and increases the gain of the canceler loop 12 accordingly. Of course, it will be recognized by those skilled in the art that a high degree of frequency stabilization can be achieved without any amplification at all.

The amplifier 16 has its output connected to a FM discriminator 18 which demodulates the oscillator signal to baseband. This baseband signal is amplified in a low noise amplifier 20 and ac-coupled in a negative feedback manner to the crystal oscillator 10 to cancel the noise sidebands induced by shock and vibration. The low noise amplifier 20 is ac-coupled to prevent the canceler loop 12 from driving the crystal oscillator frequency away from the natural frequency of the crystal. This approach allows noise sideband cancellation without tuning the center frequency of the crystal oscillator 10.

Figure 3:
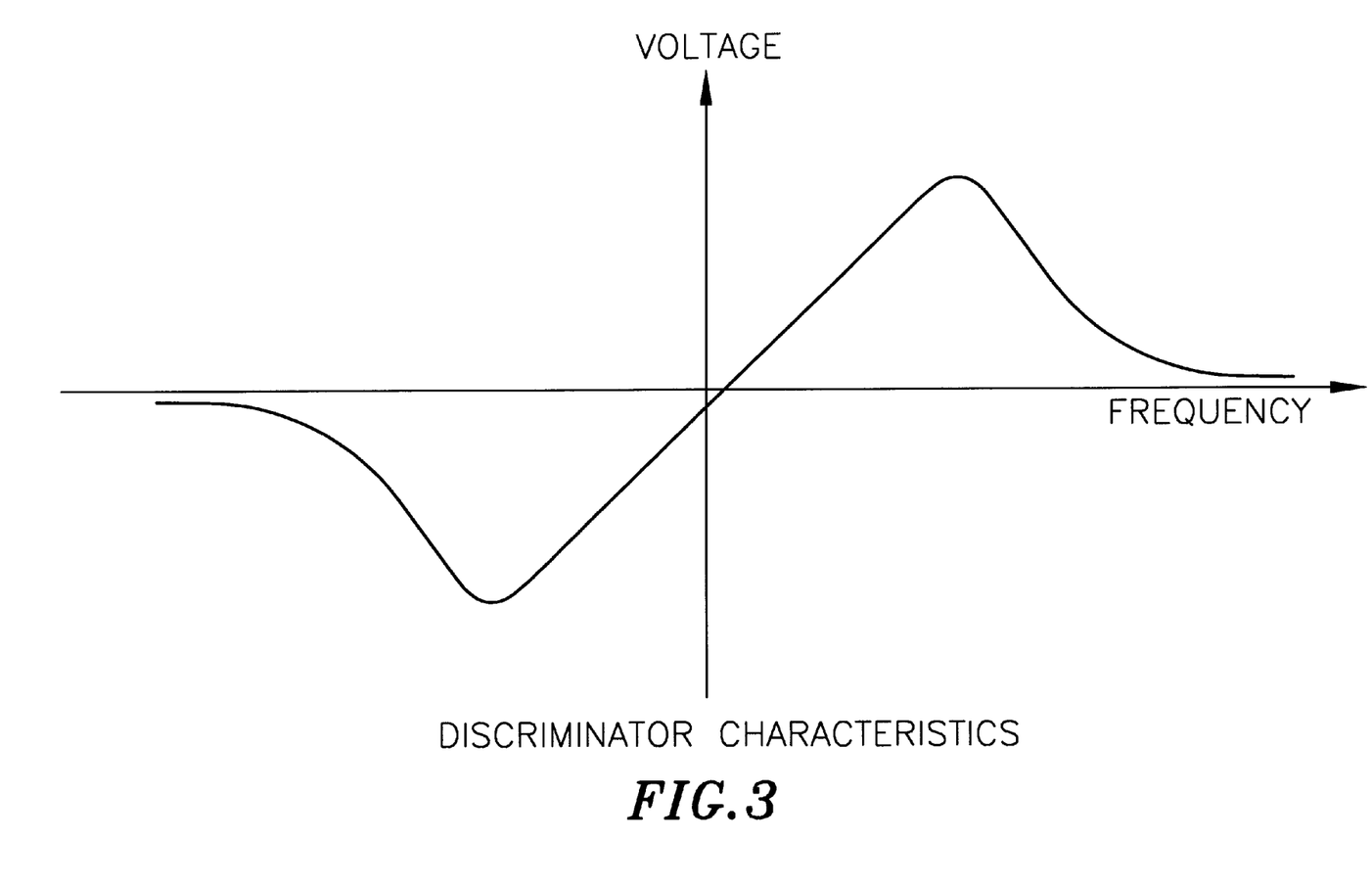
FIG. 3 is a graph showing the transfer characteristics of the FM discriminator in accordance with one embodiment of the present invention.

The transfer characteristics of the FM discriminator 18 are shown in FIG. 3. The crossover frequency of the FM discriminator 18 not need be aligned with the center frequency of the crystal oscillator 10, since the loop is ac-coupled. All that is required is that the slope of the transfer function be reasonably constant over the expected range of the oscillator frequency. The slope of the discriminator may be positive (as shown) or negative.

Figure 4:
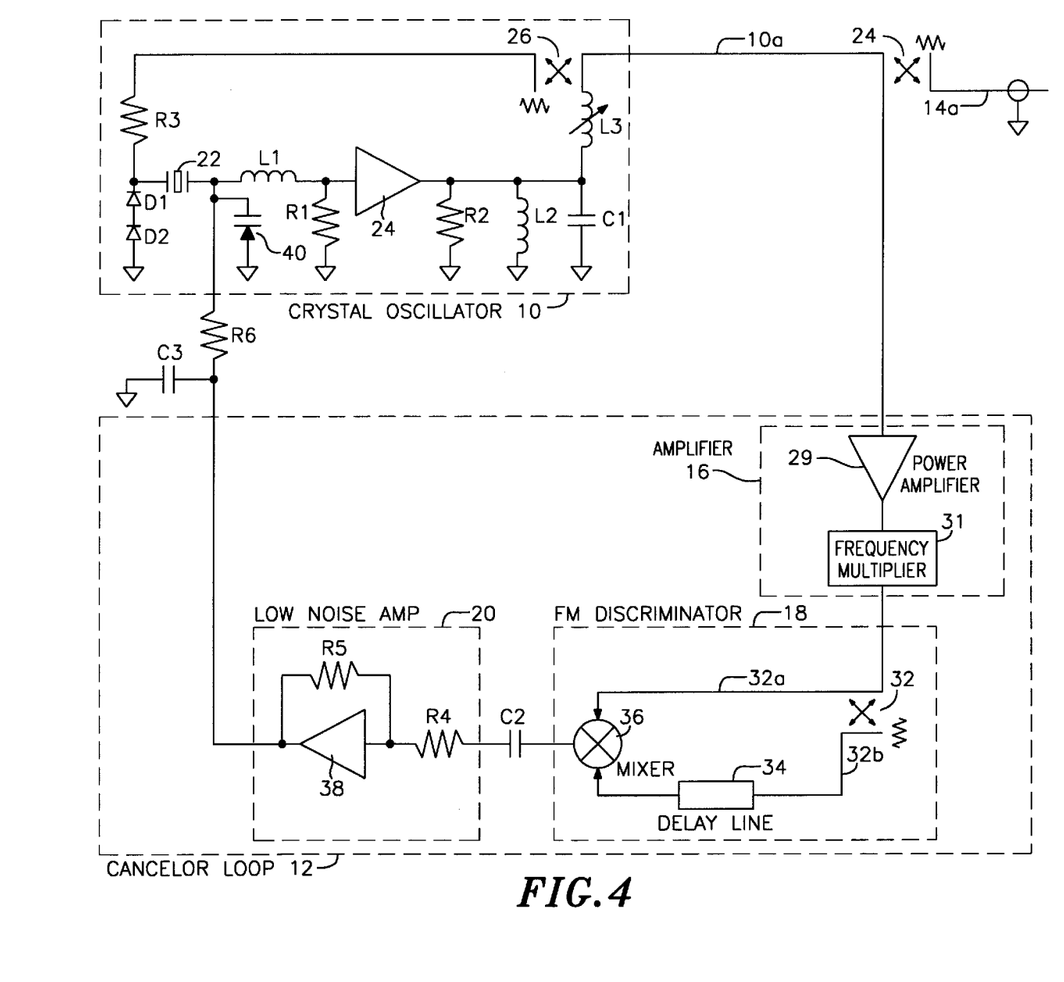
FIG. 4 is a detailed electrical schematic of one embodiment of the present invention of a crystal oscillator employing a canceler loop.

Details of the electronic circuitry for implementing an embodiment of the present invention is shown in FIG. 4. The crystal oscillator 10 includes a piezo-electric resonator 22 having a natural frequency, by way of example, at 75 MHz. The resonator output is connected to an amplifier 24 through an impedance matching network comprising a series inductor L1 and a shunt resistor R1. The impedance matching network matches the input of the amplifier 24 to the source impedance of the crystal resonator 22. The amplifier 24 provides the requisite gain to sustain the oscillation. The output of the amplifier 24 is connected to a parallel tuning circuit comprising an inductor L2 and a capacitor C1, and then fed to a 3 dB coupler 26, through an impedance matching variable inductor L3. The variable inductor L3 in conjunction with the resistor R2 at the output of the amplifier 24 provides impedance matching between the source impedance of the amplifier 24 and a 50 ohm nominal load impedance. The output signal is split into two paths at the coupler 26. A portion of the output signal power is directed to the output 10a of the crystal oscillator 10, and the remaining portion of the power is fed back to the resonator 22 in a positive feedback manner through a resistor R3. Preferably, diodes D1, D2 are provided at the input to the resonator 22 to limit the amplitude of the crystal oscillator output signal by reducing the large signal loop gain to unity.

The crystal oscillator 10 has its output connected to a 6 dB coupler 14. As explained above, the coupler 14 directs the majority of the output signal power to the canceler loop 12. The remainder of the output signal power is applied to and consumed by the loads (not shown). Preferably, a passive coupler is chosen with a coupling ratio of 80%. That is, 80% of the oscillator power is delivered to the canceler loop 12, and 20% of the oscillator power is delivered at the output 14a to the load (not shown). Of course, the precise coupling ratio is not critical to the present invention.

The amplifier 16 is connected at the front end of the canceler loop 12 to increase the sensitivity of the canceler loop and improve the degree of frequency stabilization of the crystal oscillator 10. In one embodiment, a two-stage amplifier circuit is utilized comprising a power amplifier 29 with 20 dbm of gain and a frequency multiplier 31.

The amplifier 16 has its output fed to the FM discriminator 18. A 3 dB coupler 32 is positioned at the input of the FM discriminator 18 which splits the signal from the power amplifier 16 into two channels. One channel is the crystal oscillator output signal 32a. In the other channel 32b, the crystal oscillator output signal experiences a time delay through a delay line 34 such that the two channels are 90 degrees out of phase. The two channels are fed to input ports of a mixer 36. The output of the mixer 36 is proportional to the phase difference between the two channels.

As explained above, crystal resonators are mechanical devices, and therefore, particularly susceptible to the effects of shock and vibration. Basic frequency modulation theory says that when a crystal resonator is vibrated, frequency modulated sidebands will be produced at the vibration frequency. The FM discriminator 18 demodulates the output of the crystal oscillator 10 to baseband and feeds back the demodulated output to the crystal oscillator 10 to cancel the frequency modulation sidebands. Of course, this approach requires that the FM discriminator 18 be far less sensitive to shock and vibration than the crystal resonator, otherwise the canceler loop would be ineffective because the FM discriminator would exhibit the same response to shock and vibration as the crystal oscillator. To this end, the FM discriminator 18 should be implemented separately from the crystal oscillator 10. In other words, the oscillator's 10 crystal 22 should not be used as a resonator for the FM discriminator 18. This approach has been shown to be effective in shock and vibration environments. However, increased insensitivity to shock and vibration can be achieved through specific component fabrication techniques. For example, the delay line 34 is preferably constructed with series inductors and shunt capacitors potted in a rigid material and fully encapsulated. A passive mixer 36 is also desirable.

The dc-component of the FM discriminator 18 output is removed by a series capacitor C2, and the ac-component is fed back to the crystal oscillator 10 as the stabilizing voltage. The accompanent of the FM discriminator output, or the stabilizing voltage, is applied to a low noise amplifier 20 which increases the magnitude of the frequency deviation voltage. The low noise amplifier 20 is preferably a high speed op-amp 38 having a high gain with low noise generation. The gain of the op-amp is set by a feedback resistor network R4, R5. The gain of the low noise amplifier 20 must amplify the stabilizing voltage to a level sufficient to feed back into the crystal oscillator 10.

The amplified stabilizing voltage signal is applied to a varactor 40 through a low pass filter comprising a series resistor R6 and a shunt capacitor C3. The stabilizing voltage signal applied to the varactor 40 acts to change the capacitance of the varactor 40 which changes the frequency of oscillation of the crystal oscillator 10.

It is apparent from the foregoing that the present invention satisfies an immediate need for reducing the effects of shock and vibration in crystal oscillators. It will be understood that the features of the present invention may be embodied in other specific forms and used in a variety of applications, without departing from the spirit or essential attributes of the present invention. It is, therefore, desired that the present embodiment be considered in all respects as illustrative and not restrictive, reference being made to the appended claims rather than the foregoing description to indicate the scope of the invention.

We claim:

1. A stable crystal oscillator circuit, comprising:

a crystal oscillator having an output signal comprising a center frequency and a frequency spectrum, and an input for receiving a stabilizing voltage, the frequency spectrum of the output signal being a function of the stabilizing voltage; and a canceler loop for generating the stabilizing voltage by demodulating the crystal oscillator output signal, said stabilizing voltage being coupled to the crystal oscillator input and providing noise sideband cancellation of the frequency spectrum without tuning the center frequency of the crystal oscillator output signal, said canceler loop comprising a discriminator having a mixer with first and second inputs, and a delay line comprising a plurality of series inductors and shunt capacitors potted in a rigid material and encapsulated, the crystal oscillator output signal being coupled to the first input of the mixer and the delay line, and the delayed crystal oscillator output signal from the delay line being coupled to the second input of the mixer, the mixer having an output signal comprising the stabilizing voltage, said stabilizing voltage being proportional to a phase difference between the first and second input signals to the mixer.

2. A stable crystal oscillator circuit, comprising:

a crystal oscillator having an output signal comprising a center frequency and a frequency spectrum, and an input for receiving a stabilizing voltage, the frequency spectrum of the output signal being a function of the stabilizing voltage; and a canceler loop for generating the stabilizing voltage by demodulating the crystal oscillator output signal, said stabilizing voltage being coupled to the crystal oscillator input and providing noise sideband cancellation of the frequency spectrum without tuning the center frequency of the crystal oscillator output signal, said canceler loop comprising an amplifier for amplifying the crystal oscillator output signal, and a discriminator for generating the stabilizing voltage by demodulating the amplified output signal of the crystal oscillator.

3. The circuit of claim 2 wherein said amplifier comprises a frequency multiplier.

4. The circuit of claim 3 wherein said amplifier further comprises a power amplifier connected in series with said frequency multiplier.

5. A stable crystal oscillator circuit, comprising:

a crystal oscillator having an input for receiving a stabilizing voltage, and an output signal responsive to the stabilizing voltage, said output signal having a first response to shock and vibration;

an amplifier for amplifying the crystal oscillator output signal;

a discriminator for generating the stabilizing voltage by demodulating the amplified crystal oscillator output signal, said stabilizing voltage having a second response to shock and vibration, said second response being less responsive to shock and vibration than said first response; and means for ac-coupling the stabilizing voltage from the discriminator to the input of the crystal oscillator.

6. The circuit of claim 5 wherein said amplifier comprises a frequency multiplier.

7. The circuit of claim 6 wherein said amplifier further comprises a power amplifier connected in series with said frequency multiplier.

8. A stable crystal oscillator circuit, comprising:

a crystal oscillator having an input for receiving a stabilizing voltage, and an output signal responsive to the stabilizing voltage, said output signal having a first response to shock and vibration; and a discriminator for generating the stabilizing voltage by demodulating the crystal oscillator output signal, said stabilizing voltage having a second response to shock and vibration, said second response being less responsive to shock and vibration than said first response, said discriminator comprising a mixer having a first and second input, and a delay line comprising a plurality of series inductors and shunt capacitors potted in a rigid material and encapsulated, the crystal oscillator output signal being coupled to the first input of the mixer and the delay line, and the delayed crystal oscillator output signal from the delay line being coupled to the second input of the mixer, the mixer having an output signal comprising the stabilizing voltage, said stabilizing voltage being proportional to a phase difference between the first and second input signals to the mixer.

* * * * *

UNITED STATES PATENT AND TRADEMARK OFFICE
CERTIFICATE OF CORRECTION

PATENT NO. : 5,963,098
DATED : October 5, 1999
INVENTOR(S) : Alexander MacMullen; Vaughn L. Wright Page 1 of 1

It is certified that error appears in the above-identified patent and that said Letters Patent is hereby corrected as shown below:

ABSTRACT,
Line 5, change "supplied" to -- supplies --.

Column 1,
Line 8, change "frequency modulated" to -- frequency-modulated --.
Line 49, after "occurs" insert a comma.
Line 62, change "frequency modulated" to -- frequency-modulated --.
Line 64, after "noise" insert a comma.
Line 66, replace "they" with -- crystal oscillators --.

Column 2,
Line 5, after "MHz" delete the period.
Line 14, change "millimeter wave" to -- millimeter-wave --.
Line 21, change "back to back" to -- back-to-back --.
Line 56, change "techniques" to -- technique --.

Column 3,
Line 19, change "accoupled" to -- ac-coupled --.

Column 4,
Line 22, replace "loop 12." with -- loop 12, --.
Line 59, change "is" to -- are --.

Column 6,
Line 2, change "accomponent" to -- ac-component --.

Signed and Sealed this

Twenty-fifth Day of December, 2001

Attest:

JAMES E. ROGAN
*Attesting Officer*      *Director of the United States Patent and Trademark Office*